(12) United States Patent
Kim

(10) Patent No.: US 9,956,589 B2
(45) Date of Patent: May 1, 2018

(54) METHOD FOR REPAIRING SEMICONDUCTOR PROCESSING COMPONENTS

(71) Applicant: Tokai Carbon Korea Co., Ltd, Gyeonggi-do (KR)

(72) Inventor: Joung Il Kim, Gyeonggi-do (KR)

(73) Assignee: Tokai Carbon Korea Co., LTD, Gyeonggi-Do (KR)

( * ) Notice: Subject to any disclaimer, the term of this patent is extended or adjusted under 35 U.S.C. 154(b) by 221 days.

(21) Appl. No.: 14/966,141

(22) Filed: Dec. 11, 2015

(65) Prior Publication Data

US 2016/0172215 A1    Jun. 16, 2016

(30) Foreign Application Priority Data

Dec. 12, 2014 (KR) .......................... 10-2014-0179667
Nov. 23, 2015 (KR) .......................... 10-2015-0164251

(51) Int. Cl.
| | | |
|---|---|---|
| *B05D 7/00* | (2006.01) | |
| *C23C 16/32* | (2006.01) | |
| *C23C 16/44* | (2006.01) | |

(52) U.S. Cl.
CPC .............. *B05D 7/50* (2013.01); *C23C 16/325* (2013.01); *C23C 16/4404* (2013.01); *C23C 16/4405* (2013.01)

(58) Field of Classification Search
None
See application file for complete search history.

(56) References Cited

U.S. PATENT DOCUMENTS

| | | | | |
|---|---|---|---|---|
| 4,745,007 A | * | 5/1988 | Addamiano | .......... C23C 16/325 427/249.15 |
| 5,085,727 A | * | 2/1992 | Steger | ............... H01J 37/32495 156/345.47 |
| 6,740,167 B1 | | 5/2004 | Rupp et al. | |
| 6,824,611 B1 | * | 11/2004 | Kordina | .................. C30B 23/00 117/105 |

(Continued)

FOREIGN PATENT DOCUMENTS

| | | |
|---|---|---|
| CN | 102584350 A | 7/2012 |
| CN | 103556219 A | 2/2014 |

(Continued)

OTHER PUBLICATIONS

International Search Report corresponding to International Patent Application No. PCT/KR2015/002164, dated Aug. 26, 2015—Search results only.

(Continued)

*Primary Examiner* — Robert S Loewe
(74) *Attorney, Agent, or Firm* — Lathrop Gage LLP

(57) ABSTRACT

A method of repairing a semiconductor processing component is provided, in which the method includes preparing a semiconductor processing component including a tantalum carbide (TaC) coating layer on which a silicon carbide (SiC)-deposited layer is formed, and performing a thermal process on the semiconductor processing component at a temperature of 1,700° C. to 2,700° C. under a gaseous condition using at least one gas selected from the group consisting of a gas including hydrogen, a gas including chlorine, and an inert gas, or under a vacuum condition.

9 Claims, 8 Drawing Sheets

(56) References Cited

U.S. PATENT DOCUMENTS

| | | | |
|---|---|---|---|
| 7,261,780 B2 | 8/2007 | Kiku et al. | |
| 8,216,667 B2* | 7/2012 | Fujiwara | C04B 41/009 427/372.2 |
| 9,612,215 B2* | 4/2017 | Fujita | G01N 23/2258 |
| 9,695,944 B2* | 7/2017 | Davis | F16J 15/3496 |
| 2003/0221708 A1* | 12/2003 | Ly | C23C 16/4405 134/18 |
| 2007/0264807 A1* | 11/2007 | Leone | B08B 7/00 438/507 |
| 2013/0327274 A1 | 12/2013 | Ohno et al. | |

FOREIGN PATENT DOCUMENTS

| | | |
|---|---|---|
| EP | 0 418 592 A1 | 3/1991 |
| JP | 2005-197534 A | 7/2005 |
| JP | 2005-276891 A | 10/2005 |
| JP | 2008-511753 | 4/2008 |
| JP | 2012-028385 A | 2/2012 |
| JP | 2012 222284 | 11/2012 |
| JP | 2013 207057 | 10/2013 |
| JP | 2013-207057 A | 10/2013 |
| JP | 2015-204434 | 11/2015 |
| KR | 10-0756640 B1 | 9/2007 |

OTHER PUBLICATIONS

Taiwanese Office Action corresponding to Taiwanese Patent Application No. 104141785, dated Dec. 13, 2016, 5 pages. (In Taiwanese language).

Japanese Office Action corresponding to Japanese Patent Application No. 2015-241667, dated Jan. 10, 2017, 5 pages. (In Japanese language).

Korean Office Action corresponding to Korean Patent Application No. 10-2015-0164251, dated Oct. 4, 2016.

* cited by examiner

METHOD FOR REPAIRING SEMICONDUCTOR PROCESSING COMPONENTS

CROSS-REFERENCE TO RELATED APPLICATION(S)

This application claims the benefit under 35 USC 119(a) of Korean Patent Application No. 10-2015-0164251, filed on Nov. 23, 2015, and Korean Patent Application No. 10-2014-0179667, filed on Dec. 12, 2014, in the Korean Intellectual Property Office, the entire disclosures of which are incorporated herein by reference for all purposes.

TECHNICAL FIELD

The present invention relates to a method of repairing a semiconductor processing component, and more particularly, to a method of repairing a semiconductor processing component by eliminating a silicon carbide (SiC) layer formed on the semiconductor processing component including a tantalum carbide (TaC) coating layer.

BACKGROUND ART

A semiconductor and a display may be manufactured through a series of processes including, for example, depositing a thin film, patterning, and etching, in accordance with a processing order. For the depositing process in which a reactant material and a source material in a gaseous state are injected into a reaction chamber, a substrate may be disposed inside the reaction chamber, and numerous components such as a susceptor used to dispose the substrate and a focus ring may be installed in the reaction chamber. For example, the susceptor, which is used to support the substrate in the depositing process, is a component of which a pocket is formed in an upper portion to support a single or multiple substrates. In general, a component used in semiconductor processing, which is simply referred to as a semiconductor processing component herein, may include a graphite material that is highly processible. However, in a high-temperature thermal process such as a process of depositing a silicon carbide (SiC) layer or a process of manufacturing a light emitting diode (LED), graphite-based semiconductor processing components coated with an SiC layer or a tantalum carbide (TaC) layer may be used to ensure stability.

In the semiconductor processing, numerous components along with a semiconductor substrate may be exposed to a reactant gas, and thus deposits may be formed on surfaces of such components. For example, in a case of a susceptor used in a process of depositing an SiC layer, when the SiC layer is formed to be in a greater thickness than a certain thickness, a crack may occur due to a difference in thermal expansivity between a surface of the susceptor and the formed SiC layer, or a portion of the SiC layer may fall off. For another example, in a case of a susceptor used in a process of manufacturing an LED, a quality of the LED may deteriorate due to particles attached to a surface of the susceptor.

To prevent such issues described above, it is required to perform a process of eliminating a deposit or particle formed or deposited on a surface of a semiconductor processing component used in such a depositing process. For example, in a case that an SiC layer is deposited on a TaC coating layer of a semiconductor processing component, the SiC layer may need to be eliminated through a physical method because SiC has a high chemical resistance. A conventionally used physical polishing method includes, for example, a method of using a polisher and a method of spraying dry ice, which is disclosed in Korean Patent Registration No. 10-0756640.

However, applying such a physical polishing method, a TaC coating layer of a semiconductor processing component may sustain damage, such that a base material, graphite, may be exposed. In addition, when using the physical polishing method, a wet cleaning process may be required to eliminate remaining particles, and thus a greater amount of time may be used for the overall process and productivity may decrease accordingly.

DISCLOSURE OF INVENTION

Technical Goals

An aspect of the present invention provides a method of repairing a component used in semiconductor processing, simply referred to as a semiconductor processing component herein, the method including performing a thermal process on a semiconductor processing component at a temperature of 1,700° C. to 2,700° C. under a gaseous condition using at least one gas selected from the group consisting of a gas including hydrogen, a gas including chlorine, and an inert gas or under a vacuum condition in order to eliminate a silicon carbide (SiC)-deposited layer without damage to a tantalum carbide (TaC) coating layer, and without performing an additional post-processing process.

However, technical goals to be achieved through the present invention may not be limited to the details described above, and thus it is obvious to a person having ordinary skill in the art to which the present invention belongs that other goals not described herein may be achieved through the following description.

Technical Solutions

According to an aspect of the present invention, there is provided a method of repairing a semiconductor processing component, the method including preparing a semiconductor processing component including a tantalum carbide (TaC) coating layer on which a silicon carbide (SiC)-deposited layer is formed, and performing a thermal process on the semiconductor processing component at a temperature of 1,700° C. to 2,700° C. under a gaseous condition using at least one gas selected from the group consisting of a gas including hydrogen, a gas including chlorine, and an inert gas, or under a vacuum condition.

The group consisting of the gas including hydrogen, the gas including chlorine, and the inert gas may include a hydrogen gas ($H_2$), hydrochloric acid (HCl), a chlorine gas ($Cl_2$), argon (Ar), neon (Ne), krypton (Kr), xenon (Xe), and a nitrogen gas ($N_2$).

The performing of the thermal process may include cutting a chemical bond between the SiC-deposited layer and the TaC coating layer.

The method may further include performing dry cleaning on the semiconductor processing component at a temperature of 1,700° C. to 2,700° C. under a gaseous condition using the gas comprising hydrogen.

Prior to the performing of the dry cleaning, a residue including carbon may remain on a surface of the TaC coating layer.

The dry cleaning may be performed to sublimate the residue including carbon.

Subsequent to the performing of the thermal process, the residue including carbon may have a thickness of 0.001 micrometer (μm) to 1 μm.

The SiC-deposited layer of the semiconductor processing component may have a thickness of 0.001 μm to 1,000 μm.

The semiconductor processing component may include at least one selected from the group consisting of a chamber wall, a substrate support, a ring, a gas distribution system component, and a transmission module component.

According to another aspect of the present invention, there is provided a repaired semiconductor processing component including a TaC coating layer and obtained through a repairing process including eliminating an SiC-deposited layer formed on the TaC coating layer. A residue including carbon may have a thickness of 0.001 μm to 1 μm.

The repairing process may be performed as per the method of repairing a semiconductor processing component.

The semiconductor processing component may include at least one selected from the group consisting of a chamber wall, a substrate support, a ring, a gas distribution system component, and a transmission module component.

Effects

A method of repairing a semiconductor processing component, which is described herein, may eliminate a silicon carbide (SiC)-deposited layer without causing damage to a tantalum carbide (TaC) coating layer, and thus may prevent exposure of a base graphite material and generation of a foreign material that may be caused by damage to the TaC coating layer.

Further, the method of repairing a semiconductor processing component may not require a post-processing process such as wet cleaning, and thus may reduce an overall processing time.

BRIEF DESCRIPTION OF DRAWINGS

Hereinafter, reference will be made in detail to examples with reference to the accompanying drawings, wherein like reference numerals refer to like elements throughout.

Figure 1:
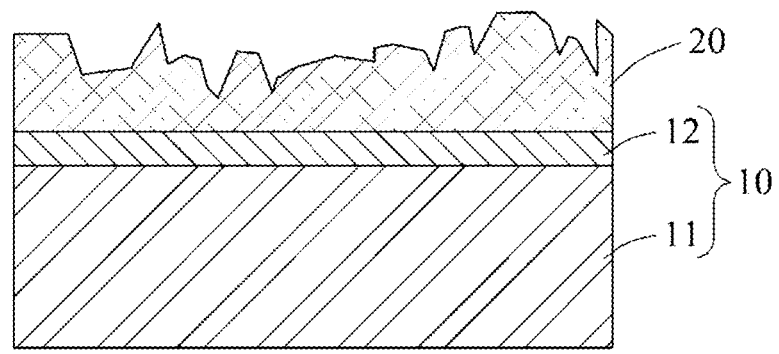
FIG. 1 is a mimetic diagram illustrating an example of a method of repairing a semiconductor processing component according to an embodiment of the present invention.
Figure 1:
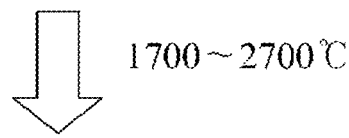
Figure 1:
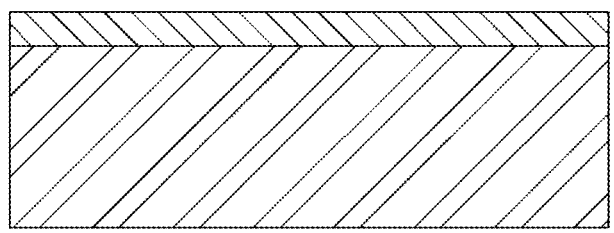

Various alterations and modifications may be made to the examples. Here, the examples are not construed as limited to the disclosure and should be understood to include all changes, equivalents, and replacements within the idea and the technical scope of the disclosure.

The terminology used herein is for the purpose of describing particular examples only and is not to limit the examples. As used herein, the singular forms "a," "an," and "the" are intended to include the plural forms as well, unless the context clearly indicates otherwise. It will be further understood that the terms "include/comprise" and/or "have" when used in this disclosure, specify the presence of stated features, integers, steps, operations, elements, components, and/or combinations thereof, but do not preclude the presence or addition of one or more other features, numbers, steps, operations, elements, components, and/or groups thereof.

Unless otherwise defined, all terms including technical and scientific terms used herein have the same meaning as commonly understood by one of ordinary skill in the art to which examples belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the examples with reference to the accompanying drawings, like reference numerals refer to like constituent elements and repeated descriptions related thereto will be omitted. When it is determined a detailed description of the examples related to a related known function or configuration may make the purpose of the examples unnecessarily ambiguous, the detailed description will be omitted.

FIG. 1 is a mimetic diagram illustrating an example of a method of repairing a component used in semiconductor processing, which will be simply referred to as a semiconductor processing component herein, according to an embodiment of the present invention.

Referring to FIG. 1, a silicon carbide (SiC)-deposited layer 20 is formed on a semiconductor processing component 10 including a tantalum carbide (TaC) coating layer 12 coated on a surface of a base graphite material 11 due to an SiC depositing process. The SiC-deposited layer 20 formed on a surface of the semiconductor processing component 10 may be eliminated through the method of repairing a semiconductor processing component according to an embodiment.

Figure 2:
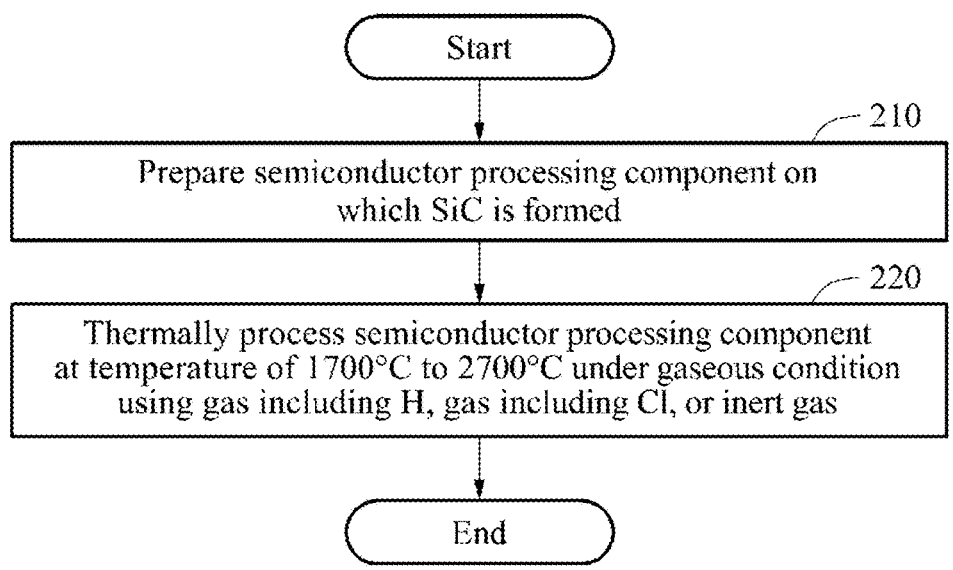
FIG. 2 is a flowchart illustrating an example of a method of repairing a semiconductor processing component according to an embodiment of the present invention.

FIG. 2 is a flowchart illustrating an example of a method of repairing a semiconductor processing component according to an embodiment of the present invention.

Referring to FIG. 2, in operation 210, a semiconductor processing component including a TaC coating layer on which an SiC-deposited layer is formed is prepared.

The semiconductor processing component may be a semiconductor processing component used to support a wafer in an SiC depositing process, and the SiC-deposited layer may be formed on an entire surface or a portion of the surface of the semiconductor processing component. The SiC-deposited layer formed on the TaC coating layer of the semiconductor processing component may be formed with uneven thicknesses of 0.001 micrometer (μm) to 1,000 μm, or 0.001 μm to 500 μm, or more particularly 1 μm to 200 μm. A thickness of the SiC-deposited layer may vary depending on a process in which the semiconductor processing component is used.

The SiC-deposited layer may need to be eliminated to prevent issues that may occur due to the SiC-deposited layer with the uneven thicknesses formed on the surface of the semiconductor processing component. The method of repairing a semiconductor processing component may be applied to eliminate such an SiC-deposited layer.

In operation 220, the semiconductor processing component is thermally processed at a temperature of 1,700° C. to 2,700° C. under a gaseous condition using at least one gas selected from the group consisting of a gas including hydrogen, a gas including chlorine, and an inert gas.

To eliminate the SiC-deposited layer formed on the TaC coating layer of the semiconductor processing component, the semiconductor processing component may be disposed in a reaction chamber, the at least one gas selected from the group consisting of the gas including hydrogen, the gas including chlorine, and the inert gas may be injected in the reaction chamber, and the semiconductor processing component in the reaction chamber may be thermally processed at the temperature of 1,700° C. to 2,700° C. As the reaction chamber, a reaction chamber that may discharge, into an additional processing device, the gas to be injected and provide heat at a temperature of at least 2,700° C. may be used. After the semiconductor processing component is disposed in the reaction chamber, the reaction chamber may be closed and the at least one gas selected from the group consisting of the gas including hydrogen, the gas including chlorine, and the inert gas may be injected.

The group consisting of the gas including hydrogen, the gas including chlorine, the inert gas to be used may include a hydrogen gas ($H_2$), hydrochloric acid (HCl), a chlorine gas ($Cl_2$), argon (Ar), neon (Ne), krypton (Kr), xenon (Xe), and a nitrogen gas ($N_2$). Here, the temperature of the thermal process may vary depending on a type of the gas to be used. For example, in a case of using an $H_2$ gas, the thermal process may be performed at a temperature of 1,700° C. to 2,700° C. or more particularly, 2,000° C. to 2,700° C. In a case of using an Ar gas, the thermal process may be performed at a temperature of 1,700° C. to 2,700° C. or more particularly, 2,300° C. to 2,700° C. In a case of using an HCl gas, the thermal process may be performed at a temperature of 1,700° C. to 2,700° C. or more particularly, 1,800° C. to 2,700° C. In a case of using an Ne gas, the thermal process may be performed at a temperature of 1,700° C. to 2,700° C. or more particularly, 2,300° C. to 2,700° C. In a case of using an $N_2$ gas, the thermal process may be performed at a temperature of 1,700° C. to 2,700° C. or more particularly, 2,300° C. to 2,700° C. An amount of an inflow of the gas may vary depending on a capacity of the reaction chamber, or the gas may be injected at 1 to 100 standard liters per minute (slm).

In the thermal process, a chemical bond between the SiC-deposited layer and the TaC coating layer may be cut. Since the TaC coating layer is stable even at a high temperature, a bond between graphite and the TaC coating layer may not be weakened through the thermal process. However, since the SiC-deposited layer is relatively unstable compared to the TaC coating layer at a high temperature, and the chemical bond between the SiC-deposited layer and the TaC coating layer is a covalent bond, the chemical bond between the SiC-deposited layer and the TaC coating layer may be cut through the thermal process to be performed at a high temperature greater than bond energy. When the chemical bond between the SiC-deposited layer and the TaC coating layer is cut, the SiC-deposited layer may be readily eliminated.

When using the gas including hydrogen (H), SiC may be sublimated in reaction to hydrogen. Here, it may be desirable to supply the gas including hydrogen having a hydrogen atom number 2 to 16 times greater than a carbon (C) atom number in the SiC. In such a case, a chemical reaction may not occur in the TaC coating layer, and the chemical bond between the SiC-deposited layer and the TaC coating layer may be cut and the SiC-deposited layer may be eliminated.

The thermal process may be performed for approximately 10 to 300 minutes, or 10 to 60 minutes, or more desirably 20 to 30 minutes. For example, when the thermal process is performed for a period of time less than 10 minutes, the SiC-deposited layer may not be eliminated. When the thermal process is performed for a period of time greater than 300 minutes, the TaC coating layer may be damaged. Thus, the terminal process may be performed by increasing the temperature by 1° C. to 100° C. per minute, or desirably by 5° C. to 20° C. per minute, to reach the temperature of 1,700° C. to 2,700° C. Here, increasing the temperature by a temperature greater than 100° C. per minute may cause damage to the TaC coating layer. A great portion of the SiC-deposited layer of the semiconductor processing component may be sublimated to be eliminated.

The semiconductor processing component to be used in the method of repairing a semiconductor processing component described herein may include at least one selected from the group consisting of a chamber wall, a substrate support, a ring, a gas distribution system component, and a transmission module component. For example, the semiconductor processing component may include, for example, a chamber wall, plates to be installed in a chamber, and a substrate support (also referred to as a susceptor), a fastener, a heating element, a plasma screen, a liner, and a ring. For another example, a gas distribution system may include, for example, a showerhead, a baffle, a nozzle ring, and the like. The transmission module component may include, for example, a robotic arm fastener, and an internal and external chamber wall. The semiconductor processing component used herein may not be limited to the foregoing examples, but may include any components used in semiconductor processing.

Figure 3:
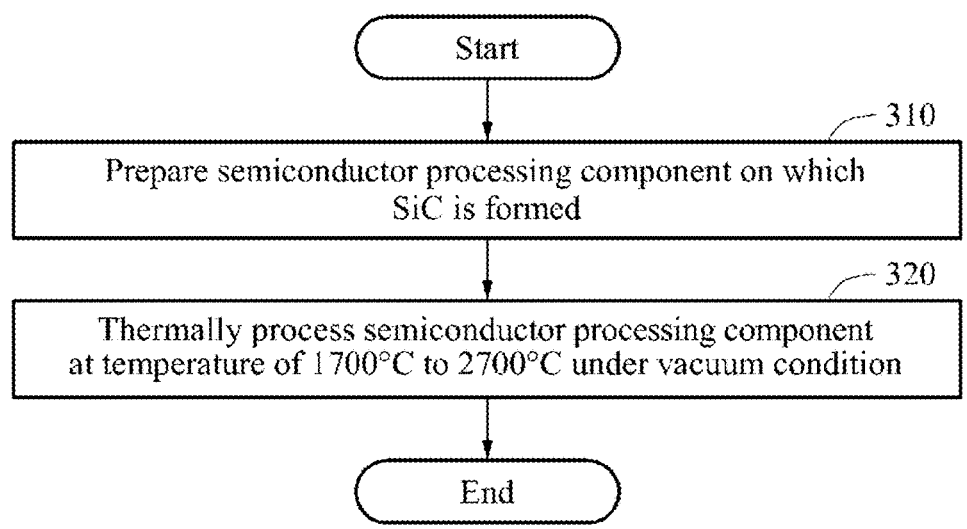
FIG. 3 is a flowchart illustrating another example of a method of repairing a semiconductor processing component according to an embodiment of the present invention.

FIG. 3 is a flowchart illustrating another example of a method of repairing a semiconductor processing component according to an embodiment of the present invention.

Referring to FIG. 3, in operation 310, a semiconductor processing component including a TaC coating layer on which an SiC-deposited layer is formed is prepared.

The semiconductor processing component may be a semiconductor processing component used to support a wafer in an SiC depositing process, and the SiC-deposited layer may be formed on an entire surface or a portion of the surface of the semiconductor processing component. The SiC-deposited layer formed on the TaC coating layer of the semiconductor processing component may be formed with uneven thicknesses. The SiC-deposited layer formed on the TaC coating layer of the semiconductor processing component may be formed with the uneven thicknesses of 0.001 μm to 1,000 μm, or 0.001 μm to 500 μm, or more particularly 1 μm to 200 μm. A thickness of the SiC-deposited layer may vary depending on a process in which the semiconductor processing component is used.

The SiC-deposited layer may need to be eliminated to prevent issues that may occur due to the SiC-deposited layer with the uneven thicknesses formed on the surface of the semiconductor processing component. The method of repairing a semiconductor processing component may be used to eliminate such an SiC-deposited layer.

In operation 320, the semiconductor processing component is thermally processed at a temperature of 1,700° C. to 2,700° C. under a vacuum condition.

To eliminate the SiC-deposited layer formed on the TaC coating layer of the semiconductor processing component, the semiconductor processing component may be disposed in a reaction chamber, and the vacuum condition may be arranged by eliminating air from the reaction chamber. Under such a vacuum condition, the semiconductor processing component in the reaction chamber may be thermally processed at the temperature of 1,700° C. to 2,700° C. The reaction chamber may include an additional device to arrange the reaction chamber to be in a vacuum state, and a reaction chamber that may provide heat at a temperature of at least 2,700° C. may be used as the reaction chamber described herein.

In the thermal process, a chemical bond between the SiC-deposited layer and the TaC coating layer may be cut. Since the TaC coating layer is stable even at a high temperature, a bond between graphite and the TaC coating layer may not be weakened through the thermal process. However, since the SiC-deposited layer is relatively unstable compared to the TaC coating layer at a high temperature, and the chemical bond between the SiC-deposited layer and the TaC coating layer is a covalent bond, the chemical bond between the SiC-deposited layer and the TaC coating layer may be cut through the thermal process to be performed at a high temperature greater than bond energy. When the chemical bond between the SiC-deposited layer and the TaC coating layer is cut through the thermal process, the SiC-deposited layer may be readily eliminated.

The thermal process may be performed for approximately 10 to 300 minutes, or 10 to 60 minutes, or more desirably 20 to 30 minutes. For example, when the thermal process is performed for a period of time less than 10 minutes, the SiC-deposited layer may not be eliminated. When the thermal process is performed for a period of time greater than 300 minutes, the TaC coating layer may be damaged. The thermal process may be performed by increasing the temperature by 1° C. to 100° C. per minute, or desirably by 5° C. to 20° C. per minute, to reach the temperature of 1,700° C. to 2,700° C. Here, increasing the temperature by a temperature greater than 100° C. per minute may cause damage to the TaC coating layer. A great portion of the SiC-deposited layer of the semiconductor processing component may be sublimated to be eliminated.

Figure 4:
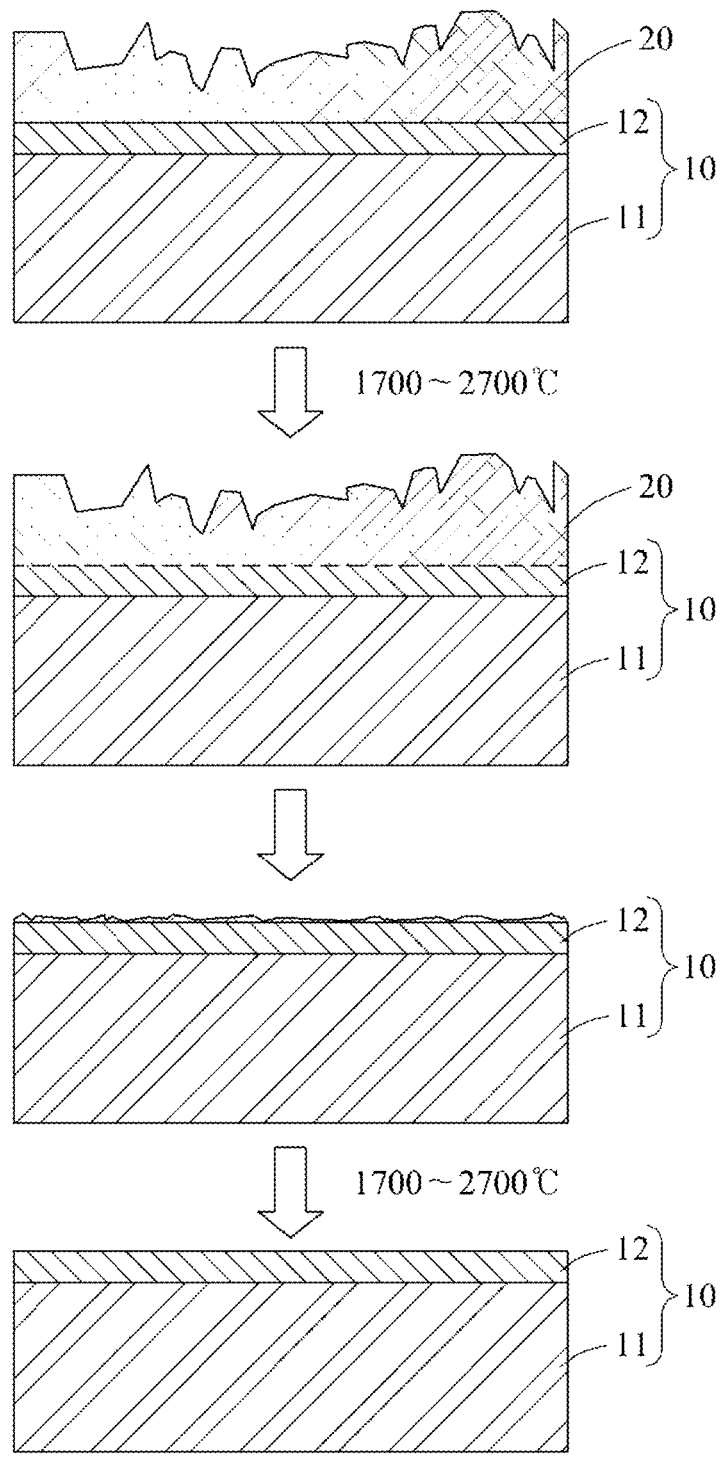
FIG. 4 is a mimetic diagram illustrating another example of a method of repairing a semiconductor processing component according to an embodiment of the present invention.

FIG. 4 is a mimetic diagram illustrating another example of a method of repairing a semiconductor processing component according to an embodiment of the present invention.

Referring to FIG. 4, an SiC-deposited layer 20 is formed on a semiconductor processing component 10 including a TaC coating layer 12 coated on a surface of a base graphite material 11 due to an SiC depositing process. The SiC-deposited layer 20 formed on a surface of the semiconductor processing component 10 may be eliminated through the method of repairing a semiconductor processing component according to an embodiment.

Figure 5:
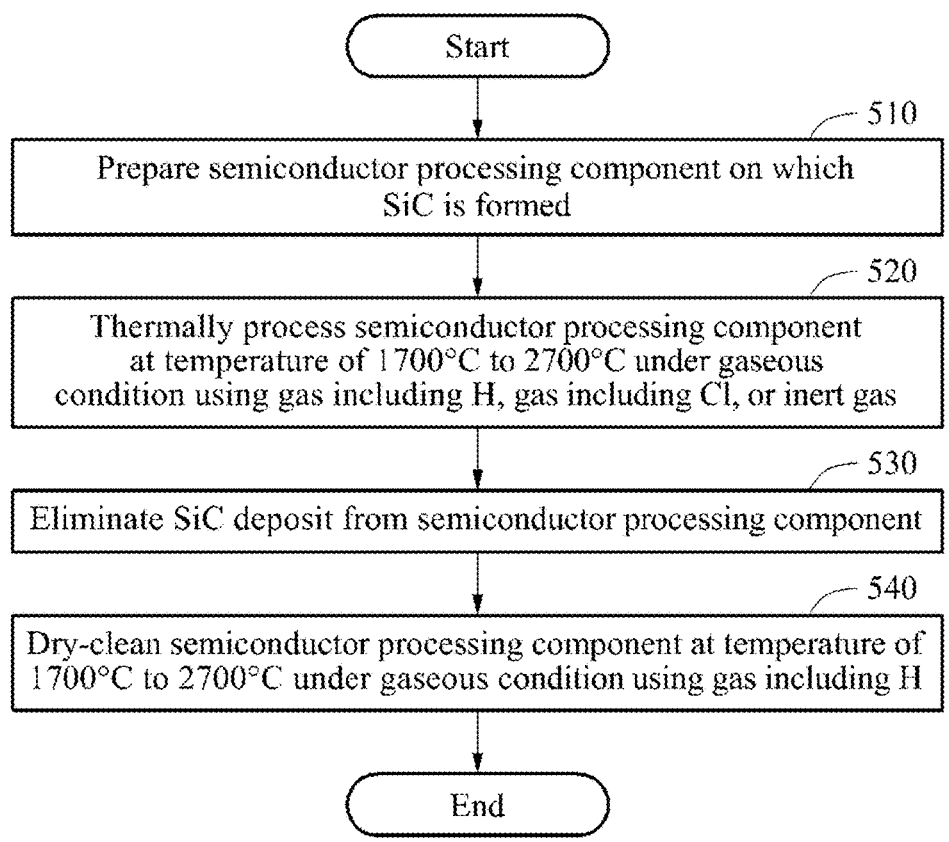
FIG. 5 is a flowchart illustrating still another example of a method of repairing a semiconductor processing component according to an embodiment of the present invention.

FIG. 5 is a flowchart illustrating still another example of a method of repairing a semiconductor processing component according to an embodiment of the present invention.

Referring to FIG. 5, in operation 510, a semiconductor processing component including a TaC coating layer on which an SiC-deposited layer is formed is prepared. In operation 520, the semiconductor processing component is thermally processed at a temperature of 1,700° C. to 2,700° C. under a gaseous condition using at least one gas selected from the group consisting of a gas including hydrogen, a gas including chlorine, and an inert gas. For a more detailed description of operations 510 and 520, reference may be made to the details of operations 210 and 220 described with reference to FIG. 2.

In operation 530, the SiC-deposited layer of the semiconductor processing component is eliminated.

Since a chemical bond between the SiC-deposited layer of the semiconductor processing component and the TaC coating layer is cut through the thermal process, a great portion of an SiC deposit may be sublimated to be eliminated. A residual SiC deposit may be readily eliminated through a physical method because a covalent bond is already cut. The physical method to be used herein may be a soft method that may not cause damage to the TaC coating layer, and the soft method may include brushing off the SiC deposit or applying a slight impact to the SiC-deposited layer.

In operation 540, the semiconductor processing component is dry-cleaned at a temperature of 1,700° C. to 2,700° C. under a gaseous condition using the gas including hydrogen.

In a case of eliminating the SiC-deposited layer using the soft physical method, a residue including carbon may remain on a surface of the TaC coating layer of the semiconductor processing component. A thickness of the residue on the semiconductor processing component may be 0.001 μm to 1 μm. The residue may include carbon, and the thickness of the residue may be 0.001 μm to 1 μm, or more particularly, 0.001 μm to 0.5 μm. The residue may be sublimated through the dry cleaning performed at the temperature of 1,700° C. to 2,700° C. under the gaseous condition using the gas including hydrogen. For example, in reaction to hydrogen (H), SiC may generate a gas such as silicon dihydride ($SiH_2$), acetylene ($C_2H_2$), and methane ($CH_4$), and thus the SiC may be sublimated.

The dry cleaning may be performed for approximately 10 to 300 minutes, or 10 to 60 minutes, or more desirably 20 to 30 minutes. For example, when the dry cleaning is performed for a period of time less than 10 minutes, the SiC residue may not be eliminated. When the dry cleaning is performed for a period of time greater than 300 minutes, the TaC coating layer may be damaged. The dry cleaning may be performed by increasing the temperature by 1° C. to 100° C. per minute, or desirably by 5° C. to 20° C. per minute, to reach the temperature of 1,700° C. to 2,700° C. Here, increasing the temperature by a temperature greater than 100° C. per minute may cause damage to the TaC coating layer.

Figure 6:
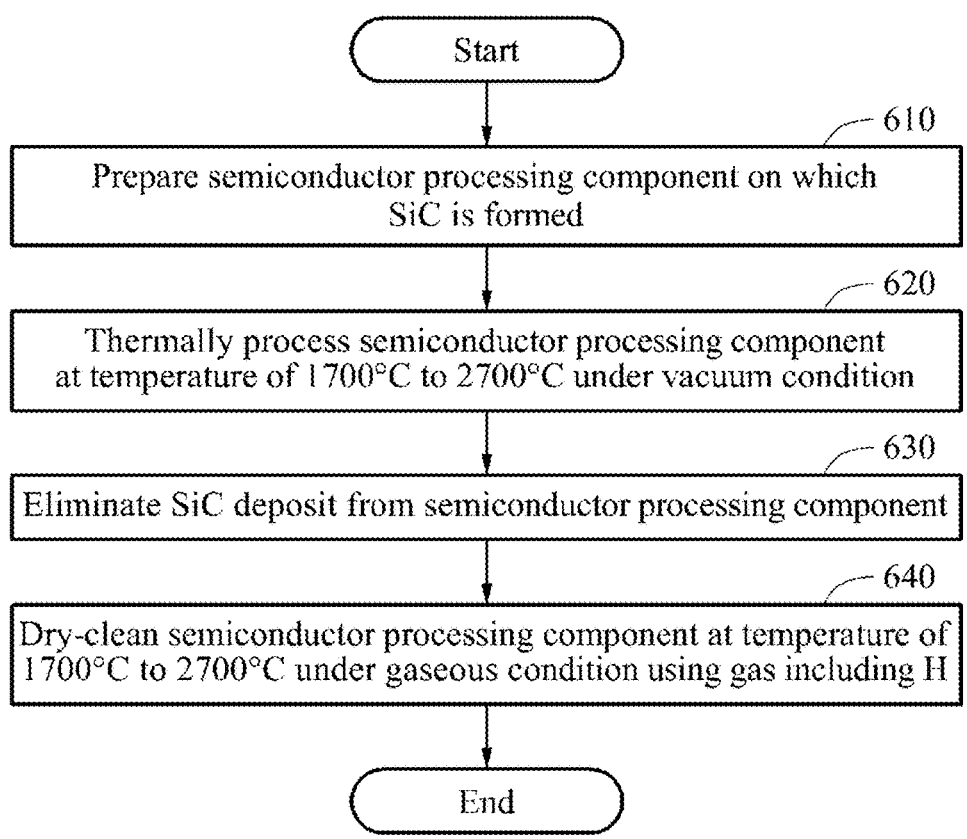
FIG. 6 is a flowchart illustrating yet another example of a method of repairing a semiconductor processing component according to an embodiment of the present invention.

FIG. 6 is a flowchart illustrating yet another example of a method of repairing a semiconductor processing component according to an embodiment of the present invention.

Referring to FIG. 6, in operation 610, a semiconductor processing component including a TaC coating layer on which an SiC-deposited layer is formed is prepared. In operation 620, the semiconductor processing component is thermally processed at a temperature of 1,700° C. to 2,700° C. under a vacuum condition. For a more detailed description of operations 610 and 620, reference may be made to the details of operations 310 and 320 described with reference to FIG. 3.

In operation 630, the SiC-deposited layer of the semiconductor processing component is eliminated. In operation 640, the semiconductor processing component is dry-cleaned at a temperature of 1,700° C. to 2,700° C. under a gaseous condition using a gas including hydrogen. For a more detailed description of operations 630 and 640, reference may be made to the details of operations 530 and 540 described with reference to FIG. 5.

In the method of repairing a semiconductor processing component, after the semiconductor processing component is thermally processed or dry-cleaned, a thickness of a residue in the semiconductor processing component may be 0.001 μm to 1 μm. The residue may include carbon, and the thickness of the residue may be 0.001 μm to 1 μm, or more particularly, 0.001 μm to 0.5 μm. According to an embodiment, in a case of performing both the thermal process and the dry cleaning, the thickness of the residue after the thermal process may be 0.001 μm to 1 μm, or more particularly, 0.001 μm to 0.5 μm. Then thickness of the residue after the dry cleaning may be 0.001 μm to 0.5 μm, or more particularly, 0.001 μm to 0.1 μm.

According to an embodiment, a repaired semiconductor processing component may include a TaC coating layer, and may be a semiconductor processing component obtained through a repairing process of eliminating an SiC-deposited layer formed on the TaC coating layer. Here, a thickness of a residue including carbon may be 0.001 μm to 1 μm. The thickness of the residue may be 0.001 μm to 1 μm, or more particularly, 0.001 μm to 0.5 μm. The repairing process may be performed as per the method of repairing a semiconductor processing component described above.

A semiconductor processing component to be used in the method of repairing a semiconductor processing component described herein may include at least one selected from the group consisting of a chamber wall, a substrate support, a ring, a gas distribution system component, and a transmission module component. For example, the semiconductor processing component may include, for example, a chamber wall, plates to be installed in a chamber, and a substrate support (also referred to as a susceptor), a fastener, a heating element, a plasma screen, a liner, and a ring. For another example, a gas distribution system may include, for example, a showerhead, a baffle, a nozzle ring, and the like. The transmission module component may include, for example, a robotic arm fastener, and an internal and external chamber wall. The semiconductor processing component used herein may not be limited to the foregoing examples, but may include any components used in semiconductor processing.

EXAMPLE: THERMAL PROCESS

A susceptor was prepared as a semiconductor processing component described herein. The susceptor includes a TaC layer coated on a surface of a base graphite material. The susceptor was used in an SiC depositing process, and a thickness of an SiC-deposited layer was measured at 50 μm using an electron microscope.

The susceptor was disposed in a reaction chamber, and an $H_2$ gas was injected therein. A thermal process was then performed for 60 minutes by increasing a temperature by 20° C. per minute to 2,000° C. After the thermal process, a thickness of the SiC-deposited layer on a surface of the susceptor was measured. An SiC residue was not discovered on a great portion of the surface of the susceptor, and a thickness of some residue remaining on the surface of the susceptor was measured at 0.01 μm. In such an example, although the susceptor was used as the semiconductor processing component, any components used in semiconductor processing may be used without limitation.

A series of the processes in the thermal process described above was repetitively performed by changing a gas to be injected, a temperature, and duration, and Table 1 indicates conditions and results of each example.

TABLE 1

| | Thickness of SiC-deposited layer prior to thermal process | Gas | Temperature | Time | Thickness of SiC-deposited layer subsequent to thermal process | State of TaC coating layer |
|---|---|---|---|---|---|---|
| Example 1 | 50 μm | $H_2$ | 2000° C. | 60 min. | 0.01 μm | good |
| Example 2 | 100 μm | $H_2$ | 2200° C. | 60 min. | 0.02 μm | good |
| Example 3 | 150 μm | HCl | 1800° C. | 120 min. | 0.02 μm | good |

EXAMPLE: THERMAL PROCESS AND DRY CLEANING

A susceptor was prepared as a semiconductor processing component described herein. The susceptor includes a TaC layer coated on a surface of a base graphite material. The susceptor was used in an SiC depositing process, and a thickness of an SiC-deposited layer was measured at 50 μm using an electron microscope. The susceptor was disposed in a reaction chamber, and an Ar gas was injected therein. A thermal process was then performed for 60 minutes by increasing a temperature by 20° C. per minute to 2,300° C. Through the thermal process, most of the SiC-deposited layer was sublimated. In addition, since a chemical bond with the TaC layer was cut, a remaining portion of the SiC-deposited layer was readily eliminated through a soft physical method, for example, slightly brushing off the remaining SiC-deposited layer. After the SiC-deposited layer was eliminated, a thickness of an SiC residue on the TaC layer was measured. The SiC residue was not discovered on a great portion of the surface of the susceptor, and a thickness of some residue remaining on the surface of the susceptor was measured at 0.1 μm. Subsequently, the susceptor was disposed in a reaction chamber again, and an HCl gas was injected therein. A dry cleaning process was performed for 20 minutes by increasing a temperature by 20° C. per minute to 1,800° C. After the dry cleaning process, a thickness of the SiC-deposited layer on the surface of the susceptor was measured. Here, an SiC residue was not discovered on a great portion of the surface of the susceptor, and a thickness of some residue remaining on the surface of the susceptor was measured at 0.01 μm. In such an example, although the susceptor was used as the semiconductor processing component, any components used in semiconductor processing may be used without limitation.

A series of the processes in the thermal process and the dry cleaning process described above was repetitively performed by changing a gas to be injected, a temperature, and duration, and Table 2 indicates conditions and results of each example.

TABLE 2

| | Thickness of SiC-deposited layer prior to thermal process | Gas | Temperature | Time | — | State of TaC coating layer |
|---|---|---|---|---|---|---|
| Thermal process | | | | | | |
| Dry cleaning | Thickness of SiC-deposited layer prior to dry | Gas | Temperature | Time | Thickness of SiC-deposited layer subsequent to dry | |

TABLE 2-continued

| | cleaning | | | | | cleaning | |
|---|---|---|---|---|---|---|---|
| Example 4 | 50 μm 0.1 μm | Ar HCl | 2300° C. 1800° C. | 60 min 20 min | — 0.01 μm | | good |
| Example 5 | 100 μm 0.2 μm | Vacuum H$_2$ | 2400° C. 2200° C. | 120 min 20 min | — 0.02 μm | | good |
| Example 6 | 200 μm 0.15 μm | Ne HCl | 2700° C. 1800° C. | 80 min 30 min | — 0.02 μm | | good |

Figure 7:
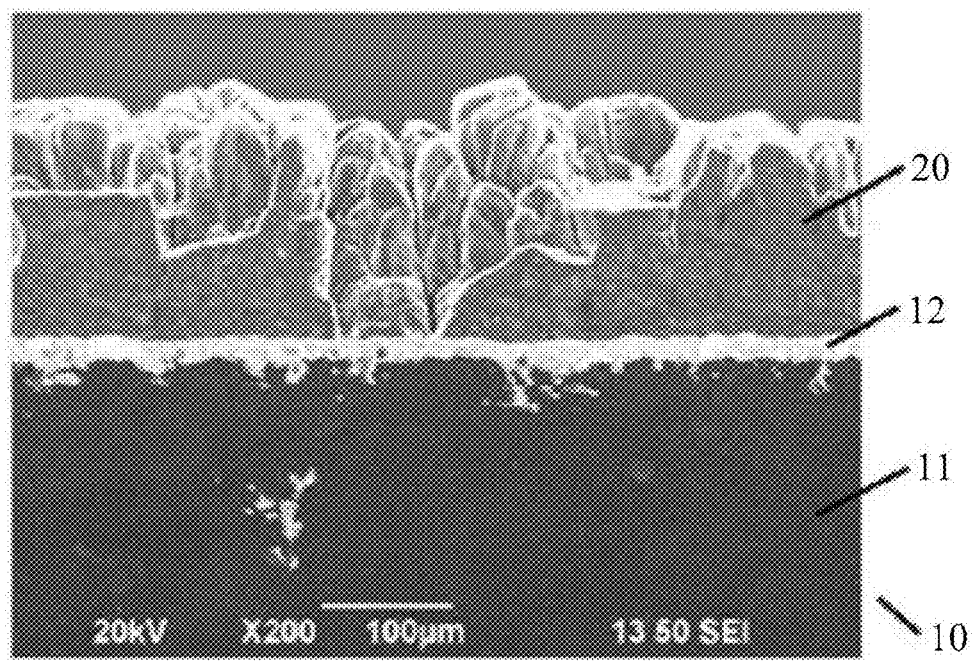
FIG. 7 is an electron microscopic image of a susceptor on which a silicon carbide (SiC) is formed according to an embodiment of the present invention.

FIG. 7 is an electron microscopic image of a susceptor on which SiC is formed according to an embodiment of the present invention. Referring to FIG. 7, an SiC-deposited layer 20 is formed on a susceptor 10 including a TaC layer 12 coated on a surface of a base graphite material 11.

Figure 8:
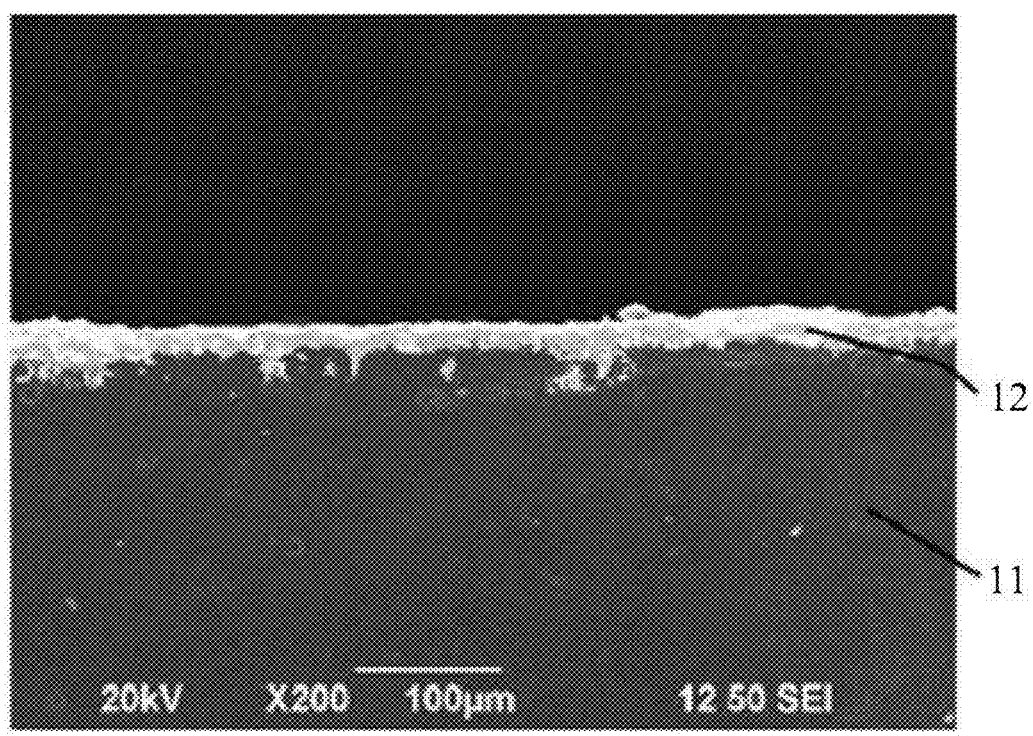
FIG. 8 is an electron microscopic image of a repaired susceptor according to an embodiment of the present invention.

FIG. 8 is an electron microscopic image of a repaired susceptor according to an embodiment of the present invention. Referring to FIG. 8, an SiC-deposited layer is not discovered after a repairing method described herein is performed.

While this disclosure includes specific examples, it will be apparent to one of ordinary skill in the art that various changes in form and details may be made in these examples without departing from the spirit and scope of the claims and their equivalents. For example, suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

I claim:

1. A method of repairing a semiconductor processing component, the method comprising:
   preparing a semiconductor processing component comprising a tantalum carbide (TaC) coating layer on which a silicon carbide (SiC)-deposited layer is formed; and
   performing a thermal process on the semiconductor processing component at a temperature of 1,700° C. to 2,700° C. under a gaseous condition using at least one gas selected from the group consisting of a gas comprising hydrogen, a gas comprising chlorine, and an inert gas or under a vacuum condition,
   wherein, subsequent to the performing of the thermal process, a residue comprising carbon having a thickness of 0.001 micrometer (μm) to 1 μm remains on a surface of the TaC coating layer.

2. The method of claim 1, wherein the group consisting of the gas comprising hydrogen, the gas comprising chlorine, and the inert gas comprises hydrogen gas (H$_2$), hydrochloric acid (HCl), chlorine gas (Cl$_2$), argon (Ar), neon (Ne), krypton (Kr), xenon (Xe), and nitrogen gas (N$_2$).

3. The method of claim 1, wherein the performing of the thermal process comprises:
   cutting a chemical bond between the SiC-deposited layer and the TaC coating layer.

4. The method of claim 1, further comprising:
   performing dry cleaning on the semiconductor processing component at a temperature of 1,700° C. to 2,700° C. under a gaseous condition using the gas comprising hydrogen.

5. The method of claim 4, wherein, prior to the performing of the dry cleaning, a residue comprising carbon remains on a surface of the TaC coating layer.

6. The method of claim 5, wherein the dry cleaning is performed to sublimate the residue comprising carbon.

7. The method of claim 1, wherein the SiC-deposited layer of the semiconductor processing component has a thickness of 0.001 μm to 500 μm.

8. The method of claim 1, wherein the semiconductor processing component comprises at least one selected from the group consisting of a chamber wall, a substrate support, a ring, a gas distribution system component, and a transmission module component.

9. A repaired semiconductor processing component, comprising:
   a tantalum carbide (TaC) coating layer, and
   wherein the semiconductor processing component is obtained through a repairing process comprising eliminating a silicon carbide (SiC)-deposited layer formed on the TaC coating layer, and
   wherein a residue comprising carbon having a thickness of 0.001 micrometer (μm) to 1 μm remains on a surface of the TaC coating layer, and
   wherein the semiconductor processing component comprises at least one selected from the group consisting of a substrate support, a ring, a gas distribution system component, and a transmission module component.

* * * * *